United States Patent [19]
Asada et al.

[11] Patent Number: 5,896,318
[45] Date of Patent: Apr. 20, 1999

[54] METHOD AND APPARATUS FOR PROTECTING CONTENT OF SEMICONDUCTOR NON-VOLATILE MEMORY AND MEMORY ITSELF

[75] Inventors: Kunihiro Asada, 1243-40 Kanasaki Showa-machi Kitakatsusika-gun Saitama 34401, Japan; Yutaka Tajima, Kanagawa, Japan

[73] Assignees: Nissan Motor Co., Ltd., Kanagawa; Kunihiro Asada, Saitama, both of Japan

[21] Appl. No.: 08/943,817

[22] Filed: Oct. 3, 1997

[30] Foreign Application Priority Data

Oct. 3, 1996 [JP] Japan ................................. 8-262976

[51] Int. Cl.$^6$ ..................................................... G11C 7/00
[52] U.S. Cl. ............................. 365/185.24; 365/185.11; 365/189.09; 365/222; 365/230.03
[58] Field of Search .......................... 365/185.24, 185.11, 365/230.03, 222, 189.09, 184

[56] References Cited

U.S. PATENT DOCUMENTS

| | | | |
|---|---|---|---|
| 5,390,148 | 2/1995 | Saito | 365/189.01 |
| 5,444,664 | 8/1995 | Kuroda et al. | 365/226 |
| 5,467,357 | 11/1995 | Asami | 371/21.3 |
| 5,825,690 | 10/1998 | Saitoh | 365/185.24 X |

FOREIGN PATENT DOCUMENTS 3-238697  10/1991  Japan .

OTHER PUBLICATIONS

VLSI Design Techniques For Analog and Digital Circuits (pp. 824 to 831) Thereof are Attached Herein (Copyright at 1990).
IEEE J Paper Tilted An 80-NS 1MB Flash Memory With On-Chip Erase/Erase-Verify Controller Found in pp. 327 to 330 Preprinted For IEEE J. Solid-State Circuits, vol. 25, No. 5, pp. 1147-1152, Oct. 1990.

Primary Examiner—Do-Hyun Yoo
Attorney, Agent, or Firm—McDermott, Will & Emery

[57] ABSTRACT

Described are method and apparatus for protecting content of a semiconductor non-volatile memory and a semiconductor non-volatile memory itself, the semiconductor non-volatile memory being constituted by, for example, a flash memory, so that a reduction in a life time of the non-volatile memory due to an excess number of times a refresh (rewrite) operation can be prevented. For example, a first data deterioration determining voltage $V_1$ is applied via a row decoder to one of word lines to which a selected bit is connected to determine whether the selected bit is turned on and a second data deterioration determining voltage $V_2$ is applied to the same word line to determine whether the selected bit is turned off. The results of the determinations are stored in a second memory unit. If the selected bit is turned on in the former result and is turned off in the latter result, a control circuit determines that the data in the selected bit is deteriorated and carries out the refresh operation for the selected bit. The value of $V_1$ is set which falls in a voltage range from a relatively high threshold voltage to a rated power supply voltage ($V_{CC}$) and the value of $V_2$ is set which falls in a voltage range from the power supply voltage ($V_{CC}$) to a relatively low threshold voltage.

32 Claims, 9 Drawing Sheets

FIG.4

| VOLTAGE APPLIED TO A WORD LINE | $V_1$ | | $V_2$ | |
|---|---|---|---|---|
| BIT STATUS | NORMAL BIT | DETERIORATED BIT | NORMAL BIT | DETERIORATED BIT |
| WRITE STATUS | OFF | ON | OFF | ON |
| ERASED STATUS | ON | ON | ON | OFF |

METHOD AND APPARATUS FOR PROTECTING CONTENT OF SEMICONDUCTOR NON-VOLATILE MEMORY AND MEMORY ITSELF

The contents of Application No. Heisei 8-262976, with a filing date of Oct. 3, 1996 in Japan, are herein incorporated by reference.

BACKGROUND OF THE INVENTION a) Field of the Invention

The present invention relates to a semiconductor non-volatile memory such as a flash memory, EPROM, or EEPROM. More particularly, the present invention relates to a technology suitably applied to method and apparatus for determining a deterioration of stored data in the semiconductor non-volatile memory and refreshing the data deteriorated non-volatile memory so as to protect memory content of the non-volatile memory and the memory itself.

b) Description of the Related Art

A Japanese Patent Application First Publication (non-examined) No. Heisei 3-238697 published on Oct. 24, 1991 exemplifies a previously proposed single-chip microcomputer having a non-volatile memory such as EEPROM (Electrically Erasable Programmable Read Only Memory).

A semiconductor device disclosed in the above-identified Japanese Patent Application First Publication is constituted by a CPU (Central Processing Unit), a memory matrix, a timer, and a write circuit including a control circuitry. The CPU is connected to the memory matrix, the timer, and the write circuit which is connected to the memory matrix and the timer. The memory matrix is constituted by a plurality of memory cells of transistors and is constituted by a flash memory or Programmable ROM such as the EEPROM or EPROM (Erasable Programmable Read Only Memory). Each non-volatile memory transistor is constituted by a bit.

Each memory cell, i.e., each non-volatile memory transistor used in Programmable ROM is generally provided with a floating gate surrounded by an insulating film. In the PROM, a high threshold value voltage condition developed due to an injection of electrons toward the floating gate is a data write and a low threshold value voltage condition developed due to a draw out of the electrons from the floating gate is a data erasure.

Each memory cell, i.e., each non-volatile memory transistor used in Programmable ROM is generally provided with a floating gate surrounded by an insulating film.

In the programmable ROM, a high threshold value voltage condition developed due to an injection of electrons to the floating gate is a data write and a low threshold value voltage condition developed due to a draw out of the electrons from the floating gate is a data erasure.

However, in such a PROM as described above, the following three problems are raised. Consequently, it cannot be guaranteed that stored data in the PROM are continued to be stably retained. That is to say, at first, in a case where an environmental temperature of the PROM in use is considerably high, e.g., in a case where the PROM is used for an automotive vehicle purpose (is used in an engine compartment of the automotive vehicle), it becomes easy for charges within the floating gate to be vanished. This is called a worsening of a retention characteristic of the PROM.

Secondly, a disturb occurs which is caused by a voltage application to a corresponding bit line or a corresponding word line when the data is written into another bit or the written data is erased.

Thirdly, a soft write occurs which is caused by electrons injections into the floating gate when the data in the corresponding bit is read.

To cope with the above-described three problems, in the semiconductor device disclosed in the above-identified Japanese Patent Application First Publication, a refresh (rewrite) operation is carried out to prevent the stored data from being inverted (or reversed). This refresh operation will be explained below briefly.

The CPU supplies a data rewrite signal to the timer and the write circuit in accordance with a program stored in the memory matrix. At this time, the timer supplies a time duration required to rewrite the data in the respective bits of the memory matrix sequentially to the write circuit and, then, the write circuit sequentially rewrites (refreshes) the data in the respective bits. The refresh operation is carried out before the data in the respective bits in the memory matrix are vanished so that the data reversal can be prevented.

SUMMARY OF THE INVENTION

However, the following problems occur in the semiconductor device disclosed in the above-identified Japanese Patent Application First Publication.

That is to say, the CPU needs to refresh the data in all bits of the non-volatile memory for each constant period of time.

In general, an approximately exponential function relationship between an average failure rate on a data retention of each bit of the non-volatile memory and an environmental temperature in use is present. In addition, the average failure rate is abruptly increased when the environmental temperature is in excess of 110° C. to 120° C.

To prevent the retention characteristic under a high temperature environment from being worsened, it is necessary to refresh the data in the respective bits at a shorter interval of time as the environmental temperature in use becomes higher. In addition, in order to present the data reversal due to the disturb and the soft write, it is necessary to refresh the data in the respective bits at an interval of time corresponding to a bias condition such that the disturb and soft write are easiest to occur.

1) Hence, if the interval of time at which the refreshing operation is carried out becomes shorter to prevent the data reversal, the number of times the refresh operation is carried out (also called a refresh rate) becomes accordingly increased.

In general, the number of times the data writes are carried out for the non-volatile memory cells are limited up to about $10^4$ through $10^5$ per a life time of the used non-volatile memory.

Therefore, too many refresh operations would bring the non-volatile memory itself into a failure with a high possibility.

In other words, since the interval of time at which the refresh operation is carried out according to the actual use condition of the semiconductor non-volatile memory, i.e., the frequency at which the refresh operation is repeated according to the actual use condition is set, the refresh operation becomes excessively frequent and the life of the semiconductor non-volatile memory becomes shortened.

Furthermore, suppose that the non-volatile memory is used in the automotive vehicle purpose. In this case, a continuously applied time of a power supply voltage to the semiconductor memory device is not permanent but, in general, is supposed to be about several hours. In this case, at least once the refresh operation is needed to be carried out within the time during which the power supply voltage is continuously applied. Consequently, the refresh rate becomes more higher so that the possibility of the semiconductor memory itself becomes more increased.

2) The refresh operation gives an effect on a reading operation the CPU executes. In the semiconductor device disclosed in the above-identified Japanese Patent Application First Publication, all bits are refreshed. In general, the data write time duration is long and it takes several minutes to complete the refresh operation for all bits. The CPU cannot read the data from the semiconductor non-volatile memory and perform arithmetic operations of the data from the semiconductor non-volatile memory while carrying out the refresh operation. Consequently, the refresh gives a remarkably ill effect on the normal operation of the CPU such that the normal operation of the CPU is halted for several minutes.

3) The refresh of the stored data cannot perfectly prevent the data reversal. That is to say, in a case where a temperature stress and a voltage stress which are remarkably higher than those initially supposed are imposed on the semiconductor device, or in a case where the data retention characteristic of any one bit or more bits is inferior to that of any other bits due to a defect in a manufacturing process, the data reversal which cannot be recovered would occur before the refresh operation is carried out.

It is, therefore, an object of the present invention to provide method and apparatus for protecting content of a semiconductor non-volatile memory and the semiconductor non-volatile memory itself which can accurately detect any one or more of memory cells (transistors) in which the data are deteriorated, which can prevent a reduction of a life of the semiconductor non-volatile memory due to an excess number of times the refresh operations are carried out, which can suppress an influence given on the operation of the CPU by shortening a time required for the refresh, and which can prevent data reversal of the bit or bits on which a temperature stress and/or a voltage stress which are remarkably higher than those of the initially supposed and data reversal of the bit or bits having inferior data retention characteristic (s).

The above-described object can be achieved by providing a method for protecting content of a semiconductor non-volatile memory and the non-volatile memory itself, the non-volatile memory being taken in a matrix form in which a plurality of memory cells are disposed at intersections of word lines and bit lines wired in the matrix formed non-volatile memory, each memory cell constituting a bit, the bit having a floating gate surrounded by an isolating film, and storing data according to a relatively high threshold voltage condition and a relatively low threshold voltage condition, each of the relatively high and low threshold voltage conditions being developed so as to correspond to a relatively large quantity of charges of electrons within each corresponding one of the floating gates of the bits and a relatively small quantity of charges of electrons therewithin, the method comprising the steps of: a) selecting any one of the bits in the non-volatile memory; b) applying a first data deterioration determining voltage to a corresponding one of the word lines in the non-volatile memory to which a control gate of the selected bit is connected, the first data deterioration determining voltage falling in a first voltage level range approximately from the relatively high threshold voltage to a rated power supply voltage to the non-volatile memory; c) storing a result of the application of the first data deterioration determining voltage from one of the bit lines of the non-volatile memory connected to the selected bit into another memory unit; d) reading the stored result of the application of the first data deterioration determining voltage at the step b); e) determining whether the selected bit in the non-volatile memory is turned on from the stored result of the application of the first data deterioration determining voltage; and f) developing a data deterioration possibility signal indicating that a possibility of the data deterioration in the selected bit is relatively high.

The above-described object can also be achieved by providing a circuitry having a semiconductor non-volatile memory, the non-volatile memory being taken in a matrix form in which a plurality of memory cells are disposed at intersections of word lines and bit lines wired in the matrix formed non-volatile memory, each memory cell constituting a bit, the bit having a floating gate surrounded by an isolating film, and storing data according to a relatively high threshold voltage condition and a relatively low threshold voltage condition, each of the relatively high and low threshold voltage conditions being developed so as to correspond to a relatively large quantity of charges of electrons within each corresponding one of the floating gates of the bits and a relatively small quantity of charges of electrons therewithin, the circuitry comprising: a) a write circuit for writing data in each bit of the non-volatile memory; b) a read circuit for reading the data in each bit of the non-volatile memory; c) a column decoder via which both the write circuit and the read circuit are connected to each of the bit lines in the non-volatile memory; d) a row decoder; a) a DC voltage generator capable of applying at least a first data deterioration determining voltage ($V_1$) to each of the word lines to which control gates of the respective bits are connected via the row decoder, the first data deterioration determining voltage falling in a first voltage level range approximately from the relatively high threshold voltage to a rated power supply voltage ($V_{CC}$); f) a control circuit for controlling operations of the write circuit, the read circuit, the column decoder, the row decoder, and the DC voltage generator; and g) a second memory unit separate from the non-volatile memory, the control circuit selecting any one of the bits in the non-volatile memory through the row decoder and the column decoder, applying the first data deterioration determining voltage to a corresponding one of the word lines in the non-volatile memory to which a control gate of the selected bit is connected via the DC voltage generator, storing a result of the application of the first data deterioration determining voltage from one of the bit lines of the non-volatile memory connected to the selected bit via the column decoder into the second memory unit, reading the stored result of the application of the first data deterioration determining voltage, determining whether the selected bit in the non-volatile memory is turned on from the stored result of the application of the first data deterioration determining voltage, and developing a data deterioration possibility signal indicating that a possibility of the data deterioration in the selected bit is relatively high.

The above-described object can also be achieved by providing an apparatus for protecting content of a semiconductor non-volatile memory and the non-volatile memory itself, the non-volatile memory being taken in a matrix form in which a plurality of memory cells are disposed at intersections of word lines and bit lines wired in the matrix formed non-volatile memory, each memory cell constituting a bit, the bit having a floating gate surrounded by an isolating film, and storing data according to a relatively high threshold voltage condition and a relatively low threshold voltage condition, each of the relatively high and low threshold voltage conditions being developed so as to correspond to a relatively large quantity of charges of electrons within each corresponding one of the floating gates of the bits and a relatively small quantity of charges of electrons therewithin, the circuitry comprising: a) first means for selecting any one of the bits in the non-volatile memory: b) second means for applying a first data deterioration determining voltage to a corresponding one of the word lines in the non-volatile memory to which a control gate of the selected bit is connected, the first data deterioration determining voltage falling in a first voltage level range approximately from the relatively high threshold voltage to a rated power supply voltage to the non-volatile memory, c) third means for storing a result of the application of the first data deterioration determining voltage from one of the bit lines of the non-volatile memory connected to the selected bit into another memory unit; d) fourth means for reading the stored result of the application of the first data deterioration determining voltage at the step b); e) fifth means for determining whether the selected bit in the non-volatile memory is turned on from the stored result of the application of the first data deterioration determining voltage; and f) sixth means developing a data deterioration possibility signal indicating that a possibility of the data deterioration in the selected bit is relatively high.

BRIEF DESCRIPTION OF THE DRAWINGS

FIG. 4 is a table representing an and off states of a representative bit in the flash memory when a first data deterioration determining voltage $V_1$ and a second data deterioration voltage $V_2$ are applied to the representative bit.

BEST MODE FOR CARRYING OUT THE INVENTION

Reference will hereinafter be made to the drawings in order to facilitate a better understanding of the present invention.

First Embodiment

Figure 1A:
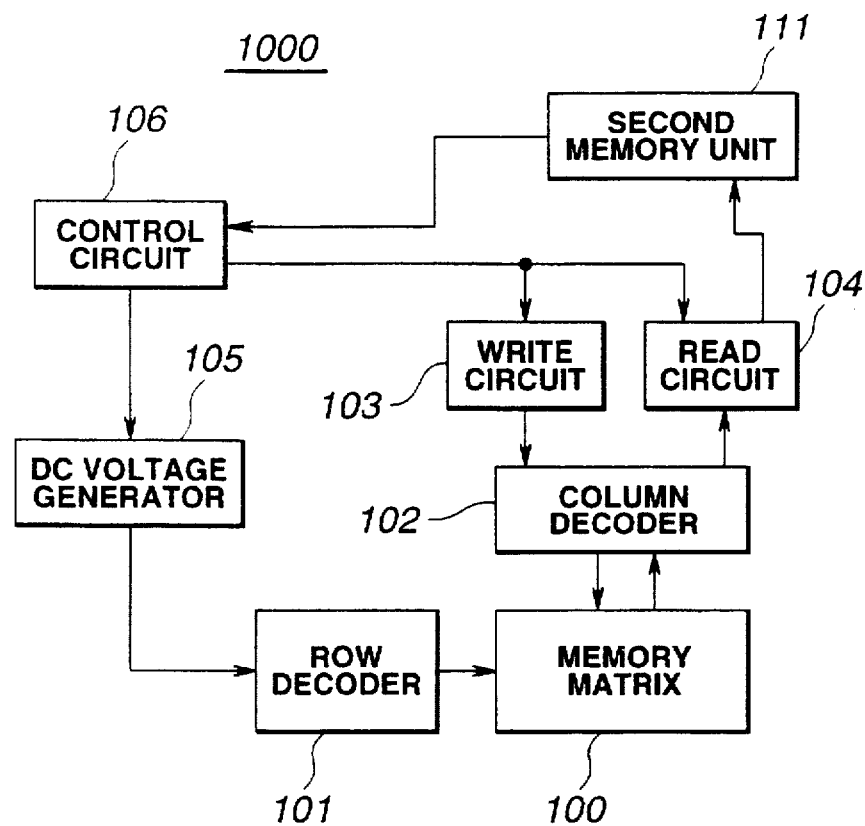
FIG. 1A is a circuit block diagram of a first preferred embodiment of an apparatus for protecting content of a semiconductor non-volatile memory and the semiconductor non-volatile memory itself according to the present invention.

FIG. 1A shows a circuit block diagram of a first preferred embodiment of an apparatus for protecting content of a semiconductor non-volatile memory and the non-volatile memory itself.

In FIG. 1A, a memory matrix 100 is constituted by a plurality of non-volatile memory transistors (or called, memory cells), each memory cell storing a data (datum) and serving as (cnstituting) a bit.

Figure 2:
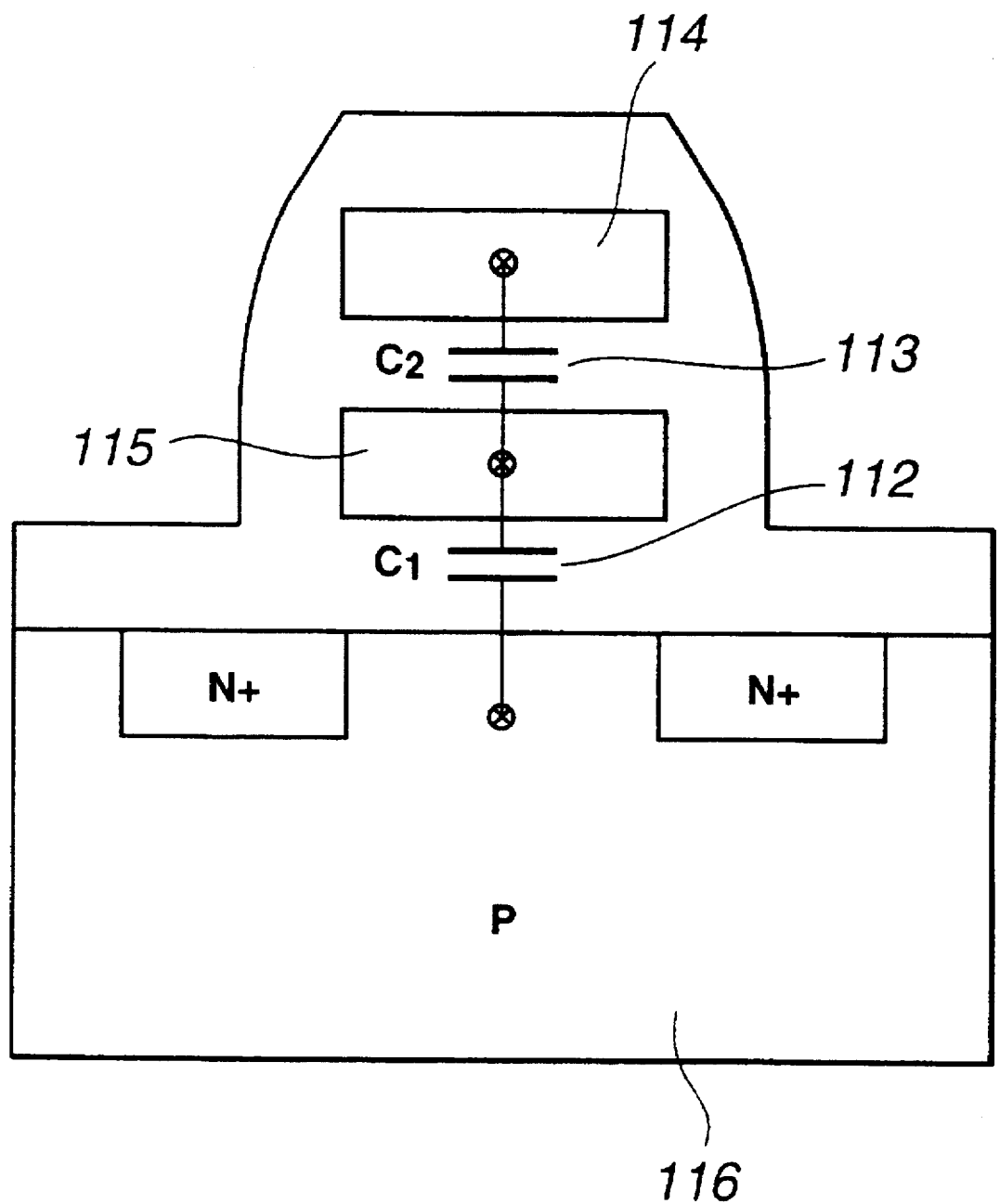
FIG. 2 is a schematic cross sectional view of a memory cell of a flash memory.

Each non-volatile memory cell has, as shown in FIG. 2, a floating gate surrounded by an isolating film such as a thin dioxide film, the data being stored in the memory cell depending on a relatively high threshold value voltage condition and a relatively low threshold value voltage condition, each threshold condition being developed so as to correspond to quantities of electrons charged within the floating gate.

In addition, bit lines wired in the memory matrix 100 are connected to a write circuit 103 and a read circuit 104 via a column decoder 102 and word lines wired in the memory matrix 100 are connected to a DC voltage generator 105 via a row decoder 101.

It is noted that operations of the write circuit 103, the read circuit 104, and the voltage generator 105 are controlled by means of a control circuit 106. In addition, a second memory unit 111 installed separately from the memory matrix 100 is connected to the control circuit 106 and the read circuit 104.

Figure 1B:
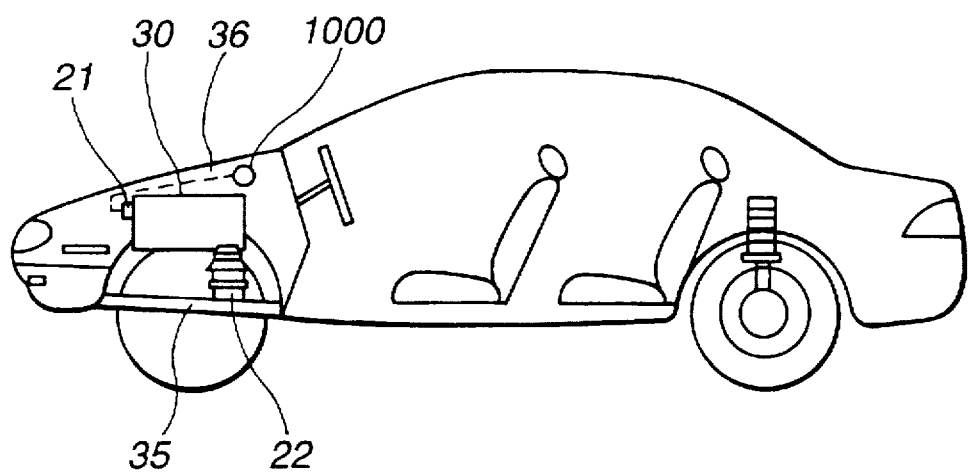
FIG. 1B is a schematic view of an automotive vehicle to which the apparatus shown in FIG. 1A (or FIG. 5A) is applicable.

A whole circuitry of FIG. 1A is denoted by 1000 and is, for example, installed within an engine hood in which a vehicular engine 30 shown in FIG. 1B is mounted.

Next, an operation of the circuitry shown in FIG. 1A will be described below.

First, a function to newly write the data in each bit of the memory matrix 100, a function to erase the data in each bit of the memory matrix 100, or a function to read the data in each bit are carried out by means of the control circuit 106, the writs circuit 103, the read circuit 104, and the DC voltage generator 105 shown in FIG. 1A. However, since these functions as described above are normal operations in a microcomputer, the detailed description thereof are omitted herein.

Figure 3:
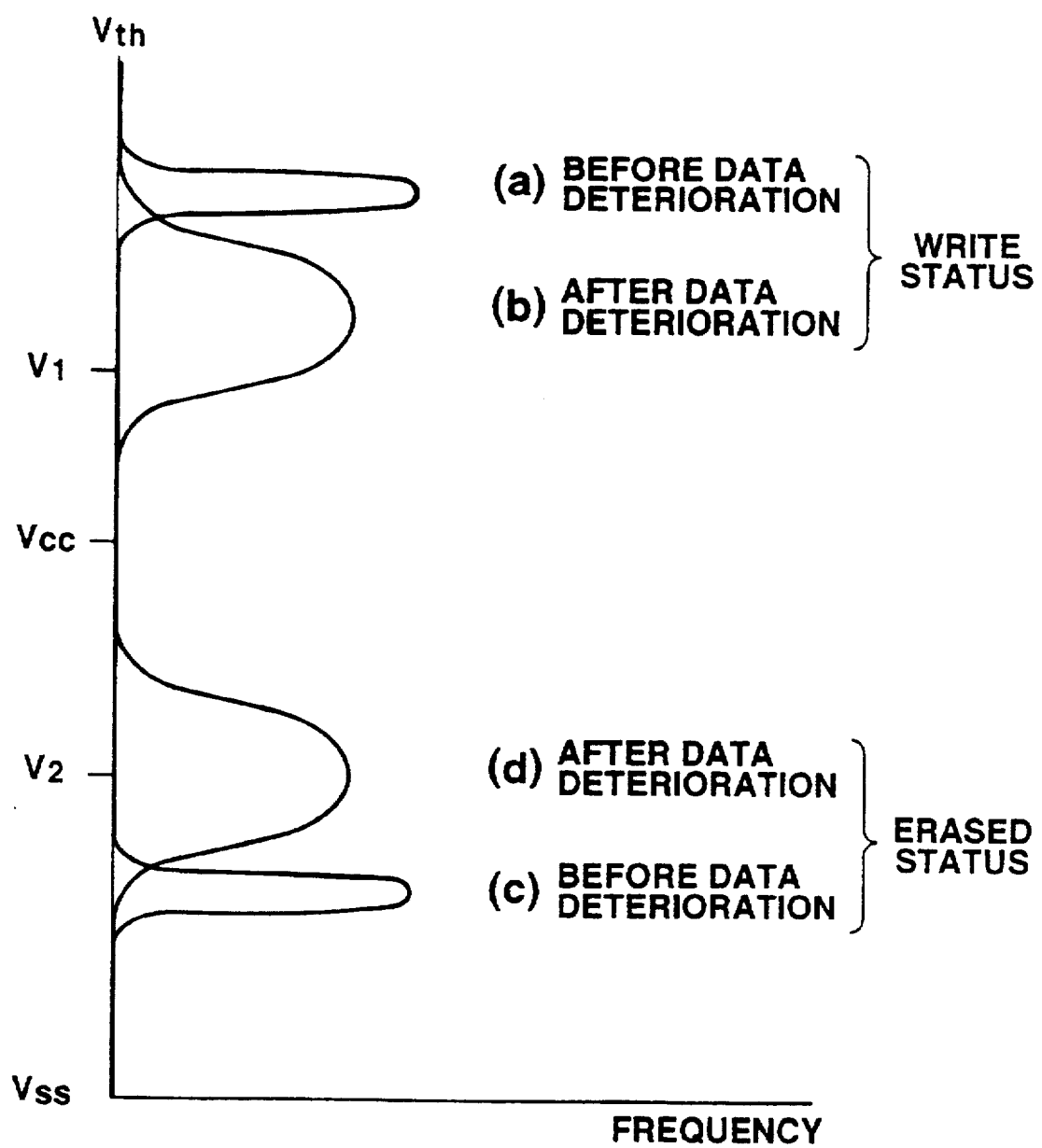
FIG. 3 is a threshold voltage distribution graph on each bit in the flash memory in a case where the stored data in each bit of the flash memory is in a data write state (high threshold value voltage condition) and in a data erasure state (low threshold value voltage condition) with respect to a use frequency.

It is noted that a relationship of a data state of a representative bit of the memory cells in the memory matrix 100 with a threshold value voltage distribution is shown in FIG. 3 provided that the data is not deteriorated. That is to say, a condition such that electrons are injected into the floating gate provided within the memory cell shown in FIG. 2 so that the threshold value voltage becomes high is a data write state and a condition such that electrons are drawn out from the floating gate of the memory cell shown in FIG. 2 so that the threshold value voltage becomes low in a data erasure state.

Since the memory matrix 100 in the first embodiment is constituted by a flash memory, the following explanation will be made.

In the flash memory, the data stored in the flash memory are susceptible to be reversed (the bit state of "1" or "0" becomes unidentified or the data indicating that the bit state of "1" is changed to "0" and vice versa) due to the worsening of a retention characteristic, due to an use high temperature environment of the flash memory, and/or due to the disturb and the soft write. The definitions of the disturb and the soft write are described in the BACKGROUND OF THE INVENTION.

In details, with the electrons injected into the floating gate are escaped away from the floating gate to a surrounding thereto, the threshold (value) voltage of each memory cell of the f lash memory under the high threshold value voltage condition tends to be increased. In another case, with the electrons injected into the floating gate, the threshold voltage of each memory cell of the flash memory under the low threshold value voltage condition tends to be augmented.

With the above-described tendencies in mind, in the first embodiment, a premonitory symptom of the data reversal is accurately detected, only the stored data in any one or more of the data which is about to indicate the data reversal is refreshed, an influence of the CPU which is being normally operated such as a program processing operation and so on is minimized so that the data reversal is prevented, and a failure (malfunction or trouble) of the flash memory itself due to an excess number of times the refresh operations are carried out is prevented.

Specifically, in FIG. 1A, one of the bits within the memory matrix 100 (assumed to be the reference numeral 110) is selected through the row decoder 101 and column decoder 102. A first data deterioration determining voltage $V_1$ is applied to any one of the word lines in the memory matrix 100 to which the corresponding one bit (110) is connected by means of the DC voltage generator 105. The first data deterioration determining voltage $V_1$ falls in a voltage level range above a rated power supply voltage Vcc and below the high threshold (value) voltage (Vth). The value of $V_{CC}$ is generally 5 volts.

Next, the determination of whether the corresponding one bit (110) is turned on or off is stored into the second memory unit 111 as a first result of the reading.

Next, a second data deterioration determining voltage $V_2$ is applied to the same word line to which the corresponding one bit (110 but not shown) is connected through the voltage generator 105.

The second data deterioration determining voltage $V_2$ falls in a voltage level range approximately below the rated (standard) power supply voltage Vcc but above the low threshold voltage (Vss).

At this time, the determination of whether the corresponding one bit (110) is turned on or off is stored into the second memory unit 111 as a second result of the reading. The voltage application, the reading operation, and the determination of whether the corresponding one bit is turned on or off is carried out in response to commands issued from the control circuit 106.

In a case where the control circuit 106 reads the stored first and second results from the second memory unit 111 and determines that the corresponding one bit 110 is turned on as the first result of reading and the corresponding one bit 110 is turned off as the second result of reading, the control unit 106 issues a data deterioration signal (DD signal) to a Central Processing Unit (hereinafter referred simply as CPU) such as a microprocessor reading the data (content) of the matrix memory 100. The CPU receives the data deterioration signal and temporarily halts the data read operation of the CPU. Then, the control circuit 106 refreshes the stored data of the bit 110.

That is to say, the refresh operation is carried out only for the data deterioration determined bit.

In addition, the above-described series of the data deterioration determination operations are sequentially carried out for the respective bits within the memory matrix 100.

The reason that the circuitry shown in FIG. 1A can accurately determine the premonitory symptom of the data reversal will be described below.

First, FIG. 2 shows a cross section of the flash memory.

It is noted that the flash memory structure is exemplified by an IEEE J paper, Solid-State Circuits, volume 25, No. 5, pages 327, 328, and 330 titled An 80-ns 1-Mb Flash Memory with On-chip Erase/Erase-Verify Controller printed in October 1990 and a U.S. Pat. No. 5,444,664, the disclosures of which are herein incorporated by reference.

In FIG. 2, a control gate 114 is formed over the floating gate 115. A gate oxide film is installed between the floating gate 115 and p-type substrate 116 to form a capacitor 112 across a dielectric. An inter-layer film between the control gate 114 and the floating gate 115 forms a capacitor 113 across a dielectric.

$C_1$ denotes an electrostatic capacitance of the capacitor of the capacitor 112 and $C_2$ denotes an electrostatic capacitance of the capacitor 113.

Suppose that an electric potential of the control gate 114 is represented by $V_{CG}$, the electric potential of the floating gate 115 is represented by $V_{FG}$, a capacitance coupling ratio r is defined in the following equation (1)

$$r = C_1/(C_1+C_2) \tag{1}$$

Hence, suppose that an electric charge Q (Q<0) is injected onto the floating gate 115, the following equation (2) is established according to a charge neutral condition concerning the floating gate 115.

$$V_{CG} = (1/r)V_{FG} - (Q/C_2) \tag{2}$$

A threshold voltage Vth as viewed front the control gate 114 is represented by the following equation (3).

$$Vth = (1/r)F_{FGO} - (Q/C_2) \tag{3}$$

In the equation (3), $V_{FGO}$ denotes a floating gate potential when the memory cell is turned on.

The variation in the threshold voltage Vth when the value of the electric charge Q is varied is expressed in the following equation (4).

$$\Delta V_{th} = -(\Delta Q/C_2)(\Delta Q < 0) \tag{4}$$

Next, FIG. 3 shows a threshold voltage distribution of each bit in a case where the stored data in the flash memory is in the data written state, that is to say, in the high threshold voltage condition.

In FIG. 3, a portion denoted by (a) represents a threshold voltage condition before the data deterioration (normal state). A variation of the characteristic in each memory cell itself causes the variation more or less in the data write state.

In FIG. 3, a portion denoted by (b) represents a threshold voltage distribution after the data is deteriorated due to the worsening of the retention characteristic and the disturb.

Since depending on a membrane quality of the gate oxide film and the inter-layer film, i.e., the presence or absence in pin holes and magnitude of a defect density, the number of electrons flowing out of the floating gate 115 is different for each bit, the value of $\Delta V_{th}$ in the equation (4) is largely different for each bit.

When the first data deterioration determining voltage $V_1$ is applied to the corresponding one each of the word lines to which the corresponding one (selected) bit (110) is connected, only the transistor, i.e., only the bit whose threshold voltage after the data deterioration is below the first data deterioration voltage $V_1$ is turned on. Hence, the bit in the data write state can detect the data deterioration before the data reversal in the bit has arrived at.

In FIG. 3, portions denoted by both (c) and (d) represent threshold voltage distributions of the respective bits under the data erasure states, (c) representing before the data deterioration and (d) representing after the data deterioration.

When the stored data in data erasure state, i.e., the stored data is under the low threshold voltage condition, the data deterioration occurs due to the electrons injected into the floating gate 115 caused by the disturb and/or soft write.

In this case, the threshold voltage is increased. Hence, when the second data deterioration determining voltage $V_2$ is applied to each of the word lines, only the transistor of any one bit whose threshold voltage is in excess of the second data deterioration determining voltage $V_2$ is turned off.

Therefore, the bit in the data erased state, the data deterioration before the data reversal can also be detected in the same way as in the data write state.

Next, the reason that in the first embodiment the data deterioration can be detected even if the transistor (the memory cell) is either the data written (write) state or the data erased (erasure) state will be described below.

FIG. 4 shows a table representing on or off state of the one memory cell (transistor) when the first data deterioration determining voltage $V_1$ and the second data deterioration determining voltage $V_2$ are applied to the (selected) bit whose stored data is deteriorated in both cases where the memory cell (memory transistor, i.e., the selected bit) is in the data write state and in the data erasure state.

As shown in FIG. 4, in the case of the memory cell (transistor) which is the normally data write state, the memory transistor is turned off when both of the first data deterioration determining voltage $V_1$ and of the second data deterioration determining voltage $V_2$ are applied thereto, respectively.

On the other hand, in the case of the memory cell (transistor) which is in the data deterioration state, the corresponding bit is turned on irrespective of the data written (write) state or the data erasure state when the first data deterioration determining voltage $V_1$ is applied thereto.

In a case where the second data deterioration determining voltage $V_2$ is applied, the memory cell (transistor) is turned off irrespective of the data write state or the data erasure state.

Hence, the read result when the first data determination voltage $V_1$ is applied to any one of the word lines to which the selected bit is connected is stored in the second memory cell 111 as the first read result. Then, the read result when the second data determination voltage $V_2$ is applied to each of the word lines is stored in the second memory unit 111 as the second result. If the memory cell (transistor) in the first read result is turned on and if the memory cell (transistor) in the second read result is turned off, it can be determined that the (selected) bit constituted by the memory cell (transistor) has been deteriorated. If only one bit which is determined for the data to be deteriorated is refreshed, the data reversal can accurately be prevented and the unnecessary refresh cannot be carried out.

As described above, the first embodiment achieves the following advantages:

1) Since the refresh operation is carried out after the actual data deterioration determination occurs, the number of time the refresh operation is carried out can be reduced as compared with a merely preventive refreshing.

Consequently, the failure in the semiconductor non-volatile memory itself due to the excessive number of times the refresh operations are carried out can be prevented and the life time of the non-volatile memory can be elongated.

2) As compared with the refresh operation for all bits in the non-volatile memory, the number of the bits to be refreshed are considerably reduced. In addition, since the time it takes for the once refresh operation is shortened, the refresh operation can be carried out during an empty time except which the CPU executes the normal (regular) operation (programming processing) and the influence of the refresh operation on the normal operation of the CPU can almost be eliminated.

3) Even in the case where the extremely higher voltage stress and/or temperature stress than the initially supposed are applied to the bit and in the case where the bit whose retention characteristic is inferior due to the temperature process problem, the deterioration of the data in the selected bit can be prevented and refreshed and the worst case of the data reversal can completely be prevented.

Figure 8A:
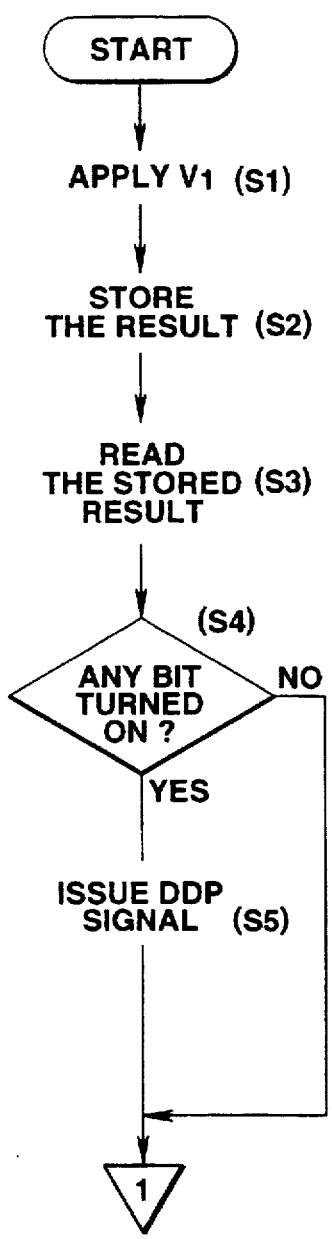
FIGS. 8A, 8B, 8C, 8D, 8E, 8F, 8G, and 8H are operational flows for explaining operations of the first and second embodiments and alternatives to each or either of the first or second embodiment, respectively.
Figure 8B:
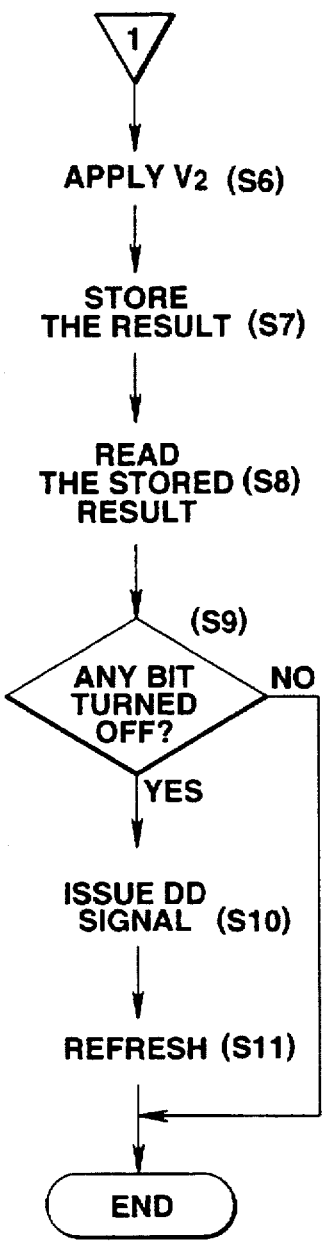

FIGS. 8A and 8B integrally show an operational flow of determining one of the memory cells whose stored data is deteriorated or of determining one of the memory cells which is failed carried out in the first embodiment described above. It is noted that the control circuit 106 shown in FIG. 1A is constituted by the CPU.

It is also noted that although at a first step (S1) in FIG. 8A the first data deteriorated determining voltage $V_1$ is applied to each word line of the non-volatile memory (memory matrix) 100, after one of the bits in the memory matrix 100 is selected through the row decoder 101 and column decoder 102, the first data deterioration determining voltage $V_1$ is applied to the corresponding one of the word lines to which the above-selected bit is connected via the DV voltage generator 105.

It is also noted that at a step (S4), the control circuit 106 determines whether the above-selected bit is turned on from the stored first result into the second memory unit 111. If it is turned on (Yes) at the step (S4), the control circuit 106 issues a data deterioration possibility signal (DDP signal) indicating that the selected bit has a possibility of data deterioration as appreciated from FIG. 4, provided that the control circuit 106 assures that the above-selected bit is in the data write state.

It is also noted that at a step (S6) in FIG. 8B the application of the second data deterioration determining voltage $V_2$ is applied to the corresponding one of the word lines to which the above-selected bit is connected, the selected bit being determined to be Yes at the step (S4).

The step (S5) in FIG. 8A may be omitted and after the step (S4), the operation flow of FIG. 8B may be entered.

It is also noted that if the above-selected bit is turned off at a step (S9) (Yes) in FIG. 8B, the control circuit 106 issues, at a step (S10), the data deterioration signal (DD signal) indicating that the data in the above-selected bit has been deteriorated in both of the data write state and the data erasure state and carries out, at a step (S11), the refresh operation for the above-selected bit which is determined to be Yes at both steps of (S4) and (S9).

The sequence of FIG. 8A and, thereafter, FIG. 8B may be reversed as FIG. 8B and, thereafter, FIG. 8A.

In this alternative case, the step (S10) may be replaced with the step (S5) and the step (S11) maybe entered after the step (S4) and the step (S10) in the sequence reversed FIG. 8A.

It is of course that the step (S1), (S2), (S3), (S6), (S7), (S8) may be carried out for all bits, the control circuit 106 may, thereafter, search for any one or more bits which are determined to be Yes at both steps of (S4) and (S9) from the first and second stored results in the second memory unit 111 and execute the refresh operation for this bit or these bits which are determined to be Yes at both steps of (S4) and (S9).

Figure 5A:
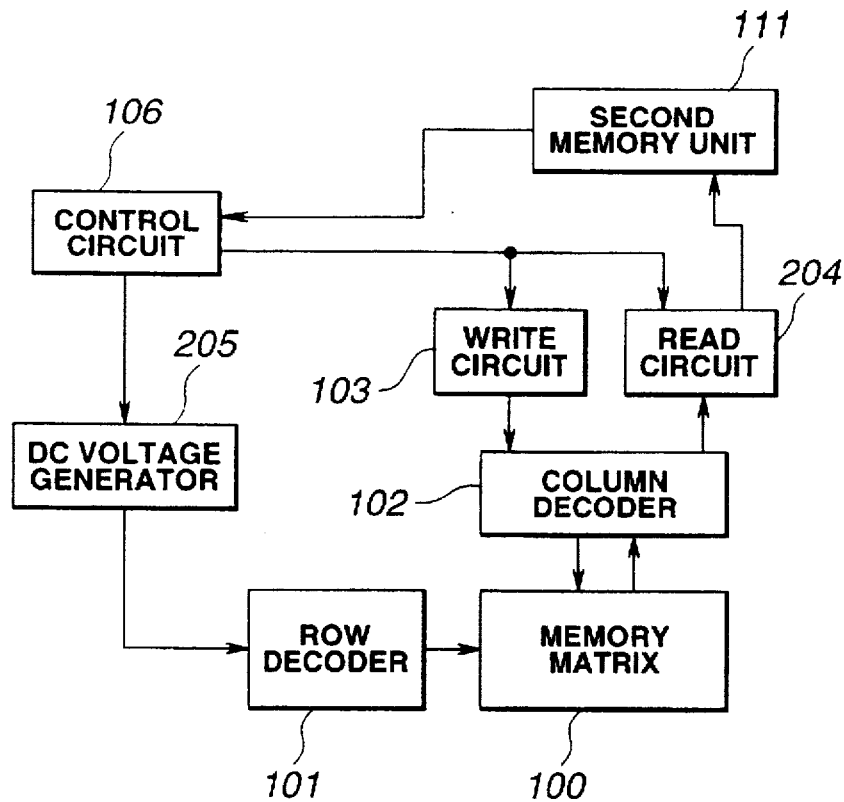
FIG. 5A is a circuit block diagram of a second preferred embodiment of the apparatus for protecting content of the semiconductor non-volatile memory and the non-volatile memory itself according to the present invention.
Figure 5B:
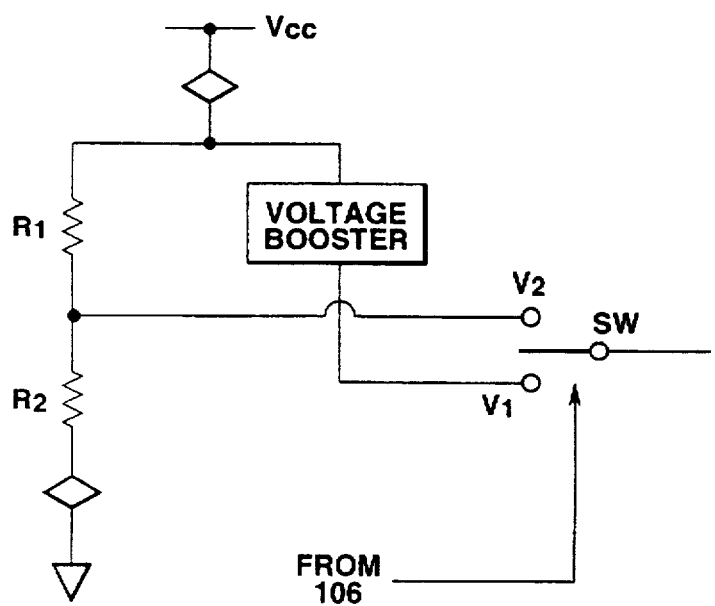
FIG. 5B is a circuit block diagram of an example of a (DC) voltage generator shown in FIG. 1A.

FIG. 5B shows a specific example of the DC voltage generator 105 in the first embodiment which generates the first and second data deterioration determining voltages $V_1$ and $V_2$ in response to a command signal from the control circuit 106 to a switch SW using a voltage divider R1 and R2 and a voltage booster in the DC voltage generator 105.

Second Embodiment

FIG. 5A shows a circuit block diagram of the apparatus for protecting content of the semiconductor non-volatile memory and the memory itself in a second preferred embodiment according to the present invention.

Figure 6:
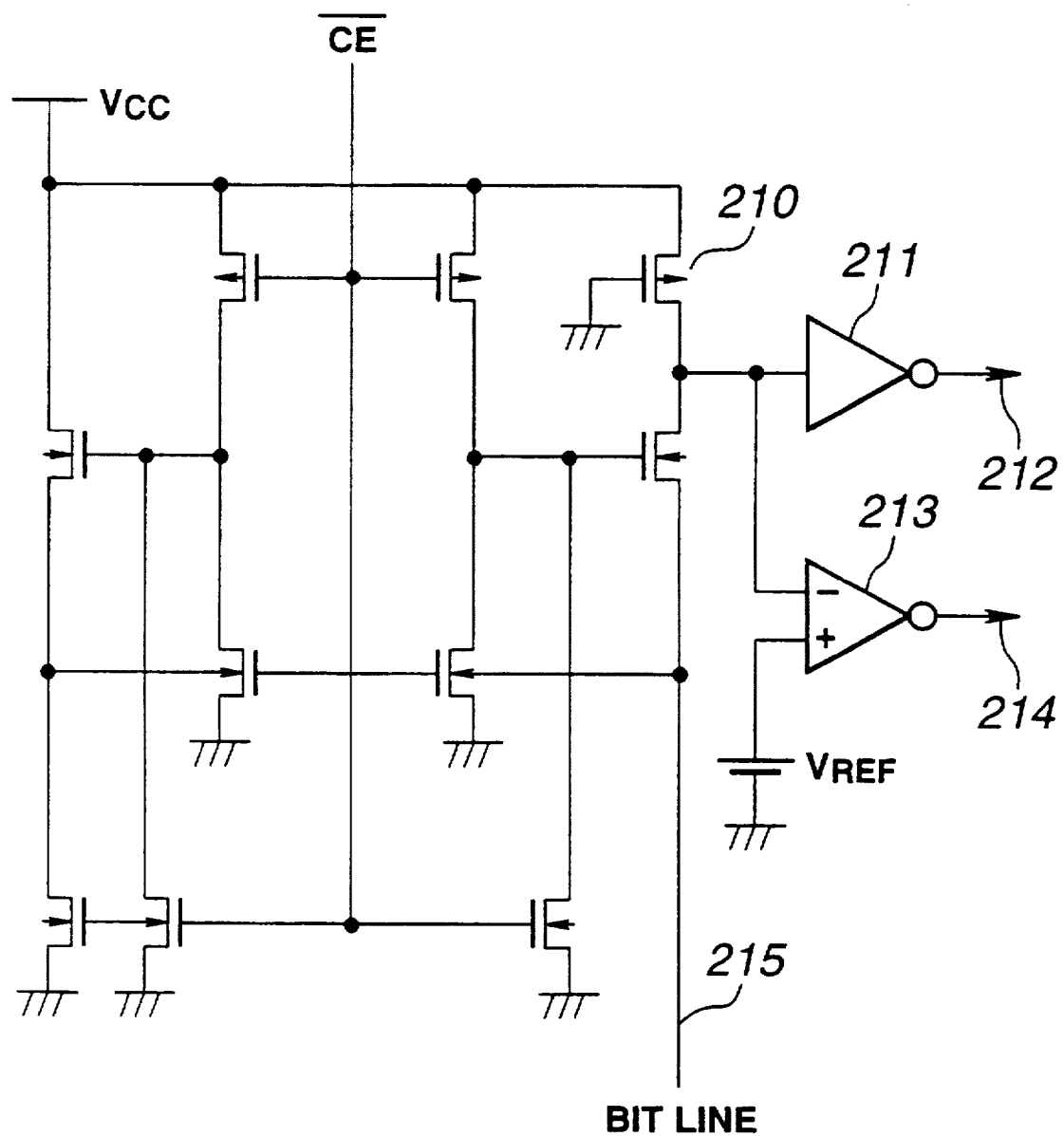
FIG. 6 is a circuit wiring diagram of an example of a sense amplifier formed in a read circuit shown in FIG. 5A.

In the second embodiment shown in FIG. 5A, another read circuit 204 having a sense amplifier, which is capable of discriminating whether a magnitude of a turn on voltage of the above-selected bit when the first data deterioration determining voltage $V_1$ is applied to the corresponding one word line to which the above-selected bit is connected, the above-selected bit being turned on, is below a turn-on voltage reference value $V_{REF}$ (refer to FIG. 6), is used in place of the read circuit 104 shown in FIG. 1A and another DC voltage generator 205 is used which is capable of outputting at least the first data deterioration determining voltage $V_1$ to the row decoder 101 in place of the DC voltage generator 105 in FIG. 1A and FIG. 5B. The other structures of the circuitry shown in FIG. 5A are generally the same as those shown in FIG. 1A. FIG. 6 shows an example of the sense amplifier in the read circuit 204.

A principle of operation in the sense amplifier in the read circuit 204 will be described below with reference to FIG. 6.

An operating point of a P-channel (MOS) transistor 210 shown in FIG. 6 is varied according to a turn on or turn off of any one or more of the memory cells (transistors) connected to one of the bit lines (BIT LINE) 215 in the memory matrix 100.

Hence, since an input voltage of an inverter 211 of the sense amplifier shown in FIG. 6 is varied so that an inverted output voltage of the inverter is varied.

Therefore, the control circuit 106 can read the stored data in the corresponding one bit connected to the BIT LINE 215.

For example, if the above-described corresponding one bit (memory cell) is turned on, a corresponding voltage drop occurs across the P-channel transistor 210 and the input logical level of the inverter 211 gives a logical Low level. Hence, an output logical level A212 of the inverter 211 is turned to a High level at a line 212.

On the other hand, an inverted input terminal (−) of a comparator 213 installed in the sense amplifier of FIG. 6 in parallel to the inverter 211 is connected to an input end of the inverter 211. A non-inverted input terminal (+) of the comparator 213 is connected to the turn-on voltage reference value $V_{REF}$. It is noted that the turn-on voltage reference value $V_{REF}$ is set to a value which corresponds to a turn off voltage of the selected bit, i.e., approximately equal to the power supply voltage across the P-channel transistor 210.

Then, when the first data deterioration determining voltage $V_1$ is applied to any one of the word lines to which the above-selected bit (described in the first embodiment) is connected, the corresponding bit is turned on. Then, when the magnitude of the turn on voltage of the corresponding memory cell (transistor) which is turned on is, at this time, lower than the turn-on voltage reference value $V_{REF}$, the output logical level of the inverter 211 is at the logical Low level but the output logical level B214 of the comparator 214 is turned to a logical High level from the logical Low level (ground) at a line 214. Consequently, the circuitry shown in FIG. 5A can determine that the magnitude of the turn on voltage of the corresponding one of the memory cells which is turned on is higher than a predetermined turn-on voltage value according to an inconsistency of the logical levels at the lines 212 and 214.

Next, an operation of the circuitry shown in FIG. 5A will be described below.

The function to newly or erase the data in each bit or any one or more of the bits in the memory matrix 100 and the function to read the stored state are the same as those in the case of the first embodiment and are the normal processing. Hence, the detailed explanation of the above-described functions are omitted herein.

Generally, a most problematic cause in the data deterioration is the worsening of the retention characteristic under the high temperature use environment from among the causes in the data deterioration, i.e., the worsening of the data retention characteristic, the disturb, and the soft write.

Especially, when the circuitry shown in FIG. 1A or FIG. 5A is installed in the automotive vehicle shown in FIG. 1B such that a maximum use environment temperature reaches 80° C. to 150° C., the problem of worsening of the retention characteristic under the high use environment temperature indicates remarkable. In addition, another problem raised in the retention characteristic is each memory cell in the data write state rather than that in the data erasure state.

This reason will be described below with reference to FIGS. 7A and 7B.

Figure 7A:
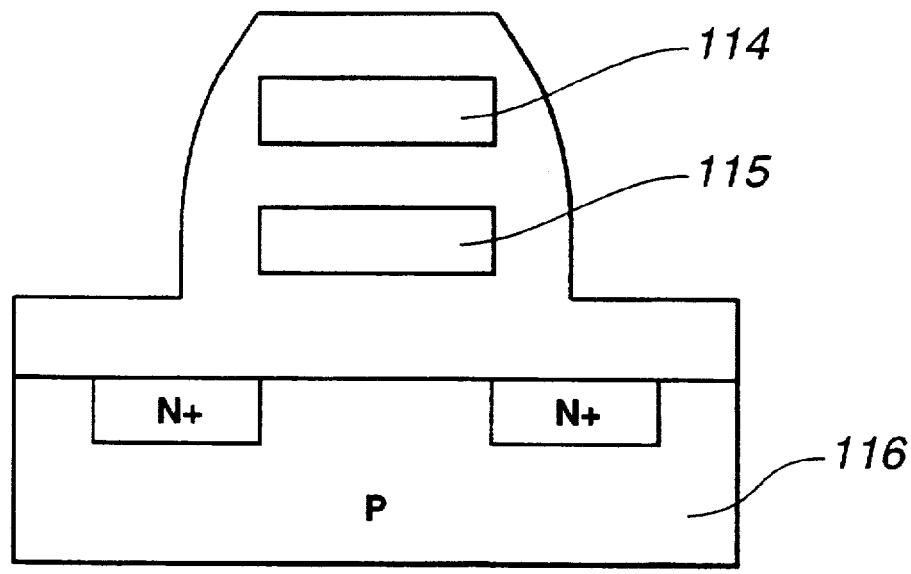
FIGS. 7A and 7B are schematic cross sectional views of each bit in a flash memory representing the data erasure state and the data write state, respectively.
Figure 7B:
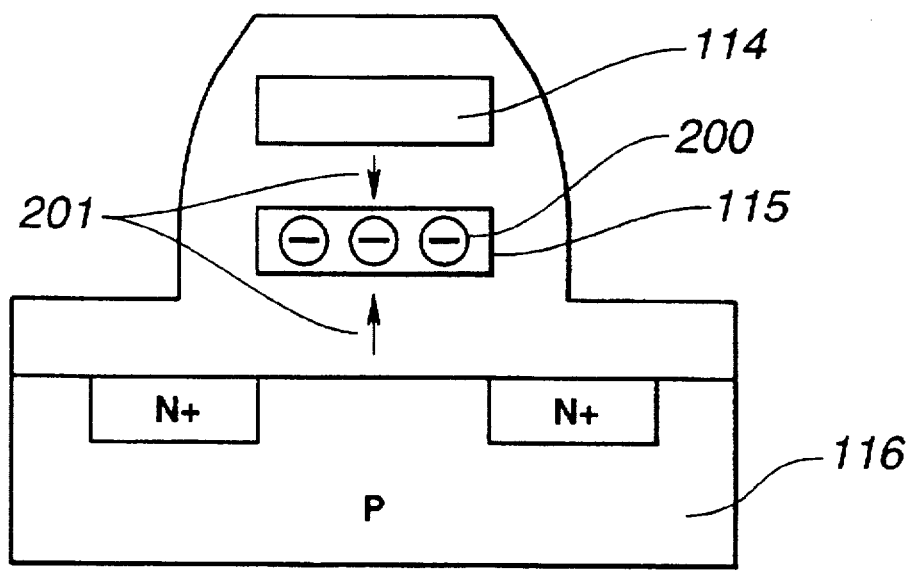

FIGS. 7A and 7B show cross sectional views of the representative memory cell in the flash memory (transistor having the floating gate), FIG. 7A illustrating that in the data erasure state and FIG. 7B illustrating that in the data write state (status).

In FIG. 7B, 200 denotes extra electrons charged across an electric field 201. The same reference numerals described in FIGS. 7A and 7B as those described in FIG. 2 designate like elements.

With no power supply voltage applied to the nonvolatile memory of the memory matrix 100, both of the p-type substrate 116 and the control gate 114 are at a ground potential (GND).

In the memory cell (transistor) in the data erasure state shown in FIG. 7A, no electron is injected onto the floating gate 115 so that no extra charge occurs. Hence, since no electric field is present between the floating gate 115 and the p-type substrate 116 or between the floating gate 115 and the control gate 114, no charge occurs on the floating gate 115. On the other hand, in the memory cell (transistor) in the data write state shown in FIG. 7A, since the extra electrons are charged onto the floating gate 115, the electric fields between the floating gate 115 and between the floating gate 115 and the control gate 114 are developed. Hence, there is a possibility of flowing out the electrons onto the floating gate 115.

In the second embodiment, with the above-described operation in the individual memory cells in mind, the data reversal (unidentified data state) of the bit(s) especially in the data write state is prevented.

Figure 8C:
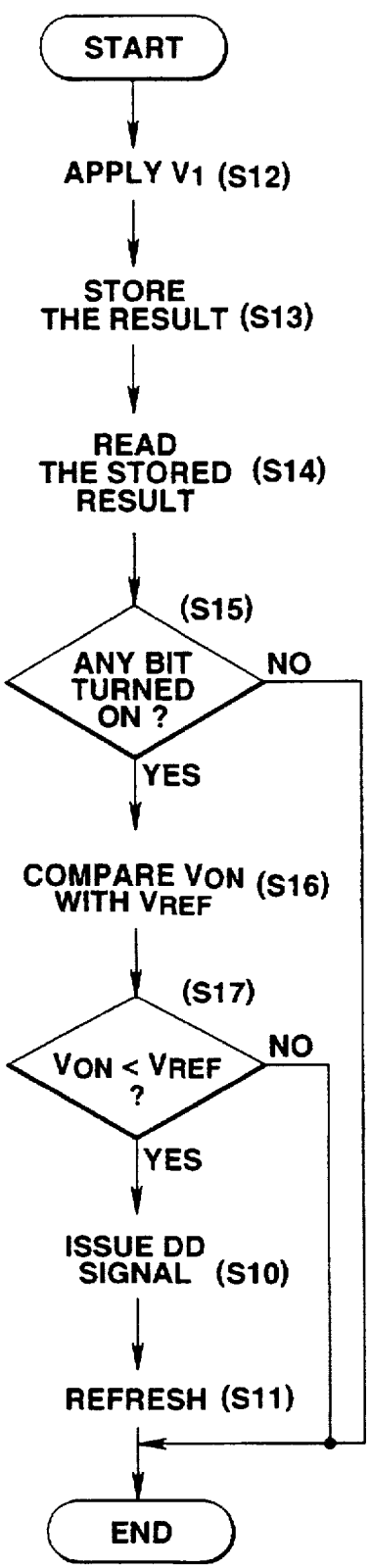

FIG. 8C shows an operation flow in the case of the second embodiment.

Specifically, in FIG. 5A, the row decoder 101 and the column decoder 102 are used to select one bit 110 (not shown) in the memory matrix 100 and the first data deterioration determining voltage $V_1$ is applied to one of the word lines to which the above-selected bit is connected through the DC voltage generator 205 (at a step (S12) in FIG. 8C). The control circuit 106 stores the result of the application of $V_1$ into the second memory unit 111.

The control circuit 106 determines whether the selected bit 110 which is turned on (yes at a step S15) has the turn on voltage ($F_{ON}$) which is below the turn-on voltage $V_{REF}$ (at a step (S17)) via the inverter 211 and via the comparator 213). It is noted that in the case where the selected bit 110 is not turned on at the step (S15), the control circuit 106 determines that the stored data in the selected bit is normal.

On the other hand, if the magnitude of the turn on voltage $V_{ON}$ of the turned on bit is so weak that $V_{ON} < V_{REF}$ (Yes at the step (S17) in FIG. 8C), the control circuit 105 determines that the high threshold voltage in the data write state in the data write state is reduced due to its data deterioration and issues the data deterioration signal (DD signal) to the CPU (or microprocessor) which reads the data in the flash memory (at a step S10).

The CPU temporarily halts the read operation of the data and the control circuit 106 refreshes the data under its deterioration in the selected bit 110. The above-described operation in the steps (S12) and (S17) is repeated for all bits in the memory matrix 100 and the refresh (at the step of (S11) in FIG. 8C) is executed thereafter for each bit (the bits) as determined Yes at the steps of (S15) and (S17).

Or, the above-described operations in the steps (S12) to (S1) in FIG. 8C is repeated sequentially for all its which are sequentially selected through the row decoder 101 and the column decoder 102.

The same effects as those described in the first embodiment can be achieved and the following effects can additionally be achieved.

1) It is not necessary to apply the second data deterioration determining voltage $V_2$ described in the first embodiment through the DC voltage generator 205. Hence, the circuit structure becomes accordingly simple.

Consequently, a degree of the integration of the circuitry can more remarkably be improved.

2) It is necessary or not necessary to carry out the refresh operation depending on only the application of the first data deterioration determining voltage $V_1$. Hence, the time it takes up to the start of the refresh operation becomes short.

After the CPU checks to see if the data deterioration occurs before the read of the data in each corresponding bit, the CPU reads the data. Consequently, a reliability of the semiconductor non-volatile memory can be increased without influence of the CPU checking operation on the normal operation of the CPU.

Alternatives

First Alternative

In a first alternative case to the first and second embodiments described above, the control circuit 106 does not carry out the refresh operation immediately after the data deterioration signal (DD signal) is issued. That is to say, an address to which any selected bit which is determined that the data is deteriorated belongs is stored into the second memory unit 111. After the determination of the data deterioration (shown in FIGS. 8A and 8B or FIG. 8C) is carried out for all bits, the refresh operation is carried out sequentially for the bit or bits whose address or addresses are stored in the second memory unit 111.

Hence, the refresh operation it takes a long time can follow the normal operation of the CPU so as not to give any influence on the normal operation of the CPU.

Second Alternative

In addition to the data deterioration determination executed in each of the first and second embodiments, a third data deterioration determining voltage $V_3$ and a fourth data deterioration determining voltage $V_4$ are applied to the selected bit (all selected bits which are determined to be data deteriorated). The third data deterioration determining voltage $V_3$ falls in a voltage level range approximately lower than the first data deterioration determining voltage $V_1$ and equal to or higher than the power supply voltage $V_{CC}$. The fourth data deterioration determining voltage $V_4$ falls in a voltage level range approximately lower than the third data deterioration determining voltage $V_3$ and higher than the second data deterioration determining voltage $V_2$.

Figure 8D:
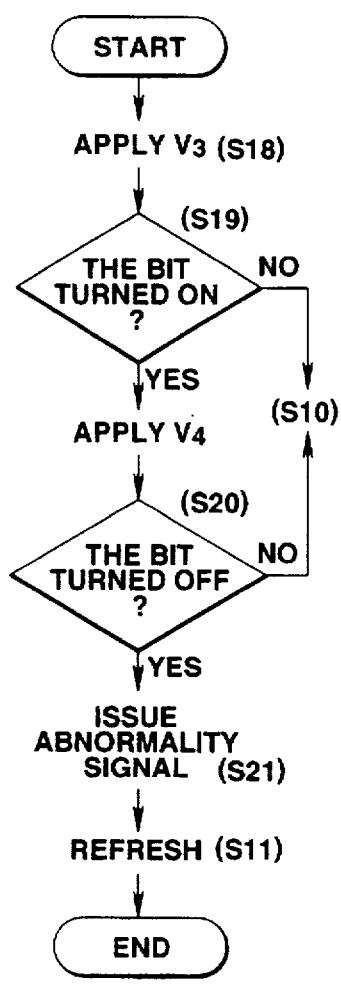

In addition to the first embodiment, when the third data deterioration determining voltage $V_3$ is applied to each of the word lines to which the selected bit is connected, the selected bit is turned on (yes at a step (S19) in FIG. 8D). When the fourth data deterioration determining voltage $V_4$ is applied to each of the word lines to which the selected bit is connected, the selected bit is turned off (Yes at a step (S20) in FIG. 8D).

In these series of cases, the control circuit 106 issues an abnormality signal (at a step (S21) in FIG. 8D) indicating that the data deterioration of the selected bit is more remarkable.

In addition to the second embodiment, when the magnitude of the turn on voltage ($V_{ON}$) of the selected bit which is turned to the on state is below the turn-on voltage reference value $V_{REF}$ (Yes at a step (S23) in FIG. 8E), the control circuit 106 issues the abnormality signal.

Figure 8E:
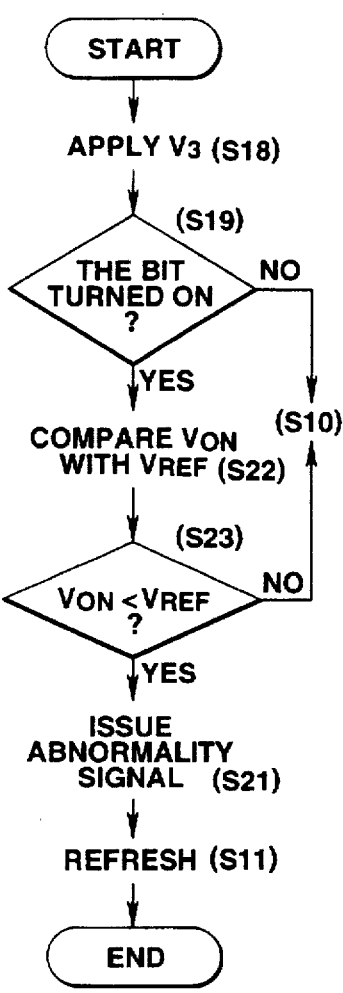

In both cases added to each of the first and second embodiments, the refresh operation may be carried out only at the steps (S11) of FIGS. 8D and 8E.

Third Alternative

Figure 8F:
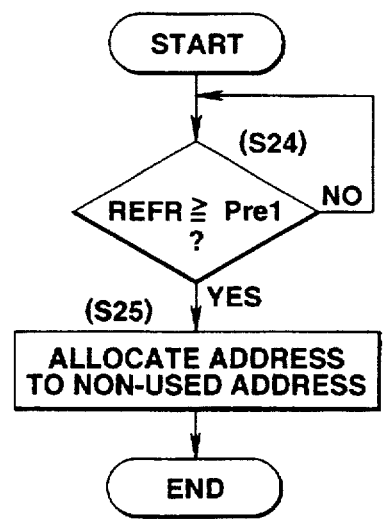
Figure 8G:
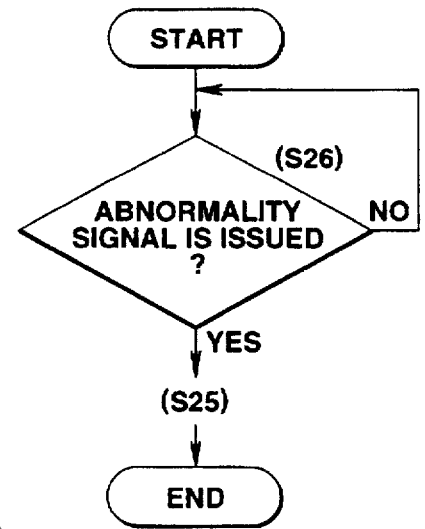

In a third alternative, when the number of times the refresh operations are carried out (also called, a refresh rate) REFR for the selected and data deterioration determined bit described in the first or second embodiment have reached to a first predetermined value Pre1 as shown in FIG. 8F or when the bit for which the abnormality signal is issued in the second alternative, a byte to which the above-described bit belongs, a memory block to which the above-described bit belongs, or an address of a sector to which the above-described bit belongs is allocated to a non-used byte, a non-used memory block, or a non-used address of a sector, respectively FIGS. 8F and 8G show two respective examples of the third alternative. It is noted that, at each of a step (S25) in FIG. 8F or FIG. 8G, the control circuit 106 carries out the above-described allocation.

Fourth Alternative

In a fourth alternative, the above-described allocation operation described in the third alternative is carried out by the CPU (microprocessor). That is to say, the control circuit 106 is constituted by the CPU (microprocessor). Thus, a special-purpose address allocation circuit is not needed and the data reversal or failure in the semiconductor non-volatile memory itself can be prevented.

Fifth Alternative

In a fifth alternative, the first data deterioration determining voltage $V_1$ or the third data deterioration determining voltage $V_3$ may be set to be approximately equal to the potential of the rated power supply voltage ($V_{CC}$).

Hence, no voltage booster (for example, that shown in FIG. 5B) which boosts the power supply voltage ($V_{CC}$) to a higher value is not needed and the circuit structure of the DC voltage generator (105 in FIG. 1A or 205 in FIG. 5A) is accordingly simplified. Consequently, the degree of the integration of the whole circuitry of the apparatus shown in FIG. 1A or 5A can be improved.

Sixth Alternative

Figure 8H:
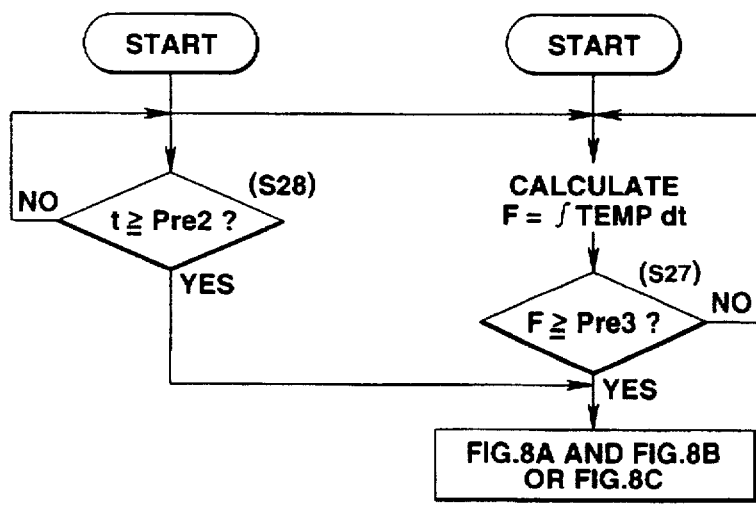

In a sixth alternative, whenever a use time duration (a total use time duration) t during which the semiconductor non-volatile memory including FIG. 1A or FIG. 5A reaches a second predetermined value Pre2 (refer to a step (S28) in FIG. 8H) or whenever a function value of F derived from the total use time (duration) t and use environmental temperature Temp of the semiconductor non-volatile memory including FIG. 1A or FIG. 5A, for example, expressed in the following equation (5) has reached to a third predetermined value Pre3 (at steps (S27) of FIG. 8H), the determination of data deterioration as described in either the first embodiment (FIGS. 8A and 8B) or second embodiment (FIG. 8C) is carried out.

$$F = \text{Temp } dt \tag{5}$$

Consequently, a timing at which, in any one or more of the bits, the data deteriorations) occurs can be optimized. In addition, a more effective refresh can be achieved before the data reversal.

Seventh Alternative

In a seventh alternative, the refresh operation is carried out after the normal operation of the CPU is halted. Or, when the power supply voltage ($V_{CC}$) is applied to the semiconductor non-volatile memory including the circuitry of FIG. 1A or FIG. 5A, the refresh operation is started before the normal operation of the CPU is started. Hence, the refresh operation cannot almost disturb the normal operation of the CPU.

Eighth Alternative

In an eighth alternative, a (data) failure detecting purpose (memory) transistor is installed for each memory block or each sector of the semiconductor non-volatile memory (memory matrix 100 in FIG. 1A or 5A). For example, a spare memory cell in each sector (or in each memory block) of the memory matrix 100 in FIG. 1A or FIG. 5A may serve as the data failure detecting purpose (memory) transistor. It is noted that, in FIG. 6, one memory cell connected to the bit line 215 in the sense amplifier via the row decoder 101 corresponds to one of the failure detecting purpose memory transistors. The structure of the spare data failure detecting purpose (memory) transistor is the same as the representative bit shown in FIG. 2.

The determination operation described in the first embodiment, the second embodiment, or the second alternative is carried out for each of the failure detecting purpose transistors installed for each corresponding one memory block or sector.

When the data deterioration is determined for any one of the data failure detecting purpose memory transistors, the refresh operation is carried out for one of the memory blocks or one of the sectors to which the corresponding one of the failure detecting purpose memory transistors belongs.

Or alternatively, when the abnormality signal described in the Second alternative is issued for any one of the failure detecting purpose memory transistors, one of the memory blocks or one of the addresses of the sectors to which the corresponding one of the failure detecting purpose memory transistors belongs is allocated correspondingly to a non-used memory block or a non-used sector address.

In the memory matrix 100 is in a large scale (the memory capacity of the memory matrix 100 is considerably large) the data deterioration can quickly be determined in a short period of time. The influence of the data deterioration determination on the normal operation of the CPU can accordingly be reduced. It is noted that the normal operation of the CPU is also referred to as a regular operation of the CPU.

Overlapped advantages can be achieved if a combination or any combinations or all combinations of each of the first through eighth alternatives are carried out.

The above description is based on an assumption such that the relatively high threshold voltage condition of any one of the bits is in the data write state (status) and the relatively low threshold voltage condition of any one of the bits is in the data erasure status (state). On the contrary, the same advantages can be achieved on the basis of the assumption such that the relatively low threshold voltage condition of any one of the bits is in the data write state (status) and the relatively high threshold voltage condition of any one of the bits is in the data erasure state (status).

In addition, as described hereinabove, the memory matrix 100 is constituted by the flash memory. However, the memory matrix 100 may be constituted by an EEPROM (Electrically Erasable Programmable Read Only Memory) or by an EPROM (Erasable Programmable Read Only Memory).

A U.S. Pat. No. 5,390,148 exemplifies the EEPROM (the disclosure of which is herein incorporated by reference).

Furthermore, suppose such a case that the refresh operation cannot be carried out due to a disabling of an effective high voltage power supply under an actual use condition in the semiconductor non-volatile memory. In this case, at first, the determination of the data deterioration in any one or more bits as described in the first or second embodiment (also first alternative) is carried out without the refresh operation.

Thereafter, as described in the third or fourth alternative, one of the memory blocks or one address of the corresponding one of the sectors to which the data deterioration determined bit belongs is allocated correspondingly to the non-used memory block or the non-used sector. Hence, even if the above-described refresh disabling case occurs, the data reversal or failure in the semiconductor non-volatile memory can positively be prevented.

Next, the following advantages can be obtained when the present invention described hereinabove is compared with a previously proposed ECC (Error Checking and Correction) circuit.

It is noted that the ECC is exemplified by a U.S. Pat. No. 5,467,357 (issued on Nov. 14, 1995).

1) The ECC circuit can correct a one-bit error from among one word or one byte. However, in the case of the present invention, as described in the first or second embodiment, there is no such a limitation as described above. The prevention against the failure can be assured.

2) The ECC circuit requires additional memory matrix having a plurality of parity bits in addition to the memory matrix. Hence, the scale of the memory unit is increased by 30% to 50% and the degree of integration of the memory unit is remarkably reduced.

However, an area of the additional circuit in the case of the present invention is considerably smaller than the area Of the memory matrix itself so that the degree of the integration of the memory unit remains approximately unchanged. Especially, as described in the eighth alternative, when the failure detecting purpose memory transistor or a spare memory transistor(s) for the data deteriorated bit(s) are installed in the memory matrix, its additional area required may be about 1% to 10% the area of the memory matrix itself. The remarkable reduction of the degree of integration does not occur.

3) Since the ECC circuit is provided with a bit error correction circuitry, an access time during the data read is increased.

In each embodiment or each alternative, the increase in the access time does not occur and the regular operation of the CPU is not affected by the access time.

Next, it is noted that the second memory unit 111 (shown in FIG. 1A or 5A) is not always constituted by the non-volatile memory unit but may be constituted by an SRAM (Static Random Access Memory) or a sequence circuit having a plurality of flip-flops.

It is also noted that since the functions of the control circuit 106 are carried out by the CPU which reads the data in the matrix memory 100 (or reads the data in the second memory unit 111), the circuit structure of the memory unit can be simplified.

Furthermore, if the semiconductor memory unit and the CPU are formed on the same semiconductor substrate, the wirings between the semiconductor memory unit and the CPU can be increased without limitation of a packaging and a degree of freedom in a design of the circuit structure can be increased.

It is noted that although, in FIG. 1B, the circuitry shown in FIG. 1A or FIG. 5A is installed within the engine hood 36 of the vehicle, a reference numeral 21 denotes a sensor for detecting, for example, an engine revolution speed, a reference numeral 22 denotes an engine mount interposed between the engine 30 and a base 32 installed on the vehicle body.

It is also noted that a counter for counting the number REFR of times the refresh operation is carried out or a timer for measuring the total time duration (t) may be installed in the control circuit 106.

It is further noted that the step (S25) in FIG. 8F includes the allocation to the non-used byte, the non-used memory block, or the non-used sector address.

What is claimed is:

1. A method for protecting content of a semiconductor non-volatile memory and the non-volatile memory itself, the non-volatile memory being taken in a matrix form in which a plurality of memory cells are disposed at intersections of word lines and bit lines wired in the matrix formed non-volatile memory, each memory cell constituting a bit, the bit having a floating gate surrounded by an isolating film, and storing data according to a relatively high threshold voltage condition and a relatively low threshold voltage condition, each of the relatively high and low threshold voltage conditions being developed so as to correspond to a relatively large quantity of charges of electrons within each corresponding one of the floating gates of the bits and a relatively small quantity of charges of electrons therewithin, the method comprising the steps of:

a) selecting any one of the bits in the non-volatile memory;

b) applying a first data deterioration determining voltage to a corresponding one of the word lines in the non-volatile memory to which a control gate of the selected bit is connected, the first data deterioration determining voltage falling in a first voltage level range approximately from the relatively high threshold voltage to a rated power supply voltage to the nonvolatile memory;

c) storing a result of the application of the first data deterioration determining voltage from one of the bit lines of the non-volatile memory connected to the selected bit into other memory unit;

d) reading the stored result of the application of the first data deterioration determining voltage at the step b);

e) determining whether the selected bit in the non-volatile memory is turned on from the stored result of the application of the first data deterioration determining voltage; and f) developing a data deterioration possibility signal indicating that a possibility of the data deterioration in the selected bit is relatively high.

2. A method for protecting content of a semiconductor non-volatile memory and the non-volatile memory itself as claimed in claim 1, which further comprises the steps of:

g) applying a second data deterioration determining voltage to the corresponding one of the word lines to which the control gate of the selected bit is connected, the second data deterioration determining voltage falling in a second voltage level range approximately from the rated power supply voltage to the relatively low threshold voltage;

h) storing a result of the application of the second data deterioration determining voltage from the bit lines of the non-volatile memory into the other memory unit;

i) reading the stored result of the application of the second data deterioration determining voltage from the other memory unit;

j) determining whether the selected bit is turned off according to the read result of the application of the second data deterioration determining voltage at the step l); and k) developing a data deterioration signal indicating that the data in the selected bit is deteriorated when determining that the selected bit of the memory cells is turned off at the step j).

3. A method for protecting content of a semiconductor non-volatile memory and the non-volatile memory itself as claimed in claim 1, which further comprises the steps of:

g) determining whether a magnitude of a turn on voltage of the selected bit is below a turn-on voltage reference value ($V_{REF}$); and h) developing a data deterioration signal indicating that the data in the selected bit of the memory cells which is determined to be turned on at the step e) is deteriorated when determining that the magnitude of the turn on voltage of the selected bit is below the turn-on voltage reference value.

4. A method for protecting content of a semiconductor non-volatile memory and the non-volatile memory itself as claimed in claim 2, which further comprising the steps of:

l) supplying the data deterioration signal to a CPU which reads the data in the non-volatile memory; and m) refreshing the data in the selected bit which is determined to be deteriorated.

5. A method for protecting content of a semiconductor non-volatile memory and the non-volatile memory itself as claimed in claim 3, which further comprises the steps of:

i) supplying the date deterioration signal to a CPU which reads the data in the non-volatile memory; and j) refreshing the data in the selected bit which is determined to be deteriorated.

6. A method for protecting content of a semiconductor non-volatile memory and the non-volatile memory itself as claimed in claim 4, wherein the step a) carries out for all bits in the non-volatile memory so as to sequentially select another bit and the refreshing at the step m) is carried out sequentially for all selected bits whose data are determined to be deteriorated.

7. A method for protecting content of a semiconductor non-volatile memory and the non-volatile memory itself as claimed in claim 5, wherein the step a) carries out for all bits in the non-volatile memory so as to sequentially select another bit and the refreshing at the step j) is carried out sequentially for all selected bits whose data are determined to be deteriorated.

8. A method for protecting content of a semiconductor non-volatile memory and the non-volatile memory itself as claimed in claim 2, which further comprises the steps of:

l) applying a third data deterioration determining voltage to the same word line to which the control gate of the selected bit is connected, the third data deterioration determining voltage falling in a voltage level range approximately equal to or below the first data deterioration determining voltage but above the rated power supply voltage ($V_{CC}$);

m) determining whether the selected bit is turned on when the third data deterioration determining voltage is applied at the step l);

n) applying a fourth data deterioration determining voltage to the same word line to which the control gate of the selected bit which is turned on at the step l) is connected, the fourth data deterioration determining voltage falling in a voltage level range approximately below the third data deterioration determining voltage but above the second data deterioration determining voltage;

o) determining whether the selected bit is turned off when the fourth data deterioration determining voltage is applied; and p) developing an abnormality signal indicating that a magnitude of the data deterioration in the selected bit is more remarkable than that on the basis of which the data deterioration signal is issued when determining that the selected bit is turned off at the step m).

9. A method for protecting content of a semiconductor non-volatile memory and the non-volatile memory itself as claimed in claim 3, which further comprises the steps of:

i) applying a second data deterioration determining voltage to the same word line to which the control gate of the selected bit which is determined to be turned on at the step e) is connected, the second data deterioration determining voltage falling in a voltage level range approximately equal to or below the first data deterioration determining voltage but above the rated power supply voltage ($V_{CC}$);

j) determining whether the magnitude of the turn on voltage of the selected bit at the step i) is above the turn-on voltage reference value ($V_{REF}$) when the second data deterioration determining voltage is applied to the same word line; and k) developing an abnormality signal indicating that a magnitude of the data deterioration in the selected bit is more remarkable than that on the basis of which the data deterioration signal is issued when determining that the selected bit is turned off at the step j).

10. A method for protecting content of a semiconductor non-volatile memory and the non-volatile memory itself as claimed in claim 9, which further comprises the step of l) refreshing the data in the selected bit when the abnormality signal is developed.

11. A method for protecting content of a semiconductor non-volatile memory and the non-volatile memory itself as claimed in claim 10, wherein the refreshing at the step l) is carried out for all selected bits in the non-volatile memory on the basis of each of which the abnormality signal is developed and which the method further comprises the step of m) allocating a byte, a memory block, or an address of a sector, to each of which any selected bit on the basis of which the abnormality signal is developed belongs to a non-used byte, a non-used memory block, or a non-used address of the sector when the abnormality signal is developed for any selected bit.

12. A method for protecting content of a semiconductor non-volatile memory and the non-volatile memory itself as claimed in claim 6, which further comprises the steps of:

n) counting a number of times the refreshing is carried out; and n) allocating a byte, a memory block, or an address of a sector, to each of which a corresponding one of the selected bits for which the refreshing is carried out belongs, to a non-used byte, a non-used memory block, or non-used address of the sector when the counted number of times the refreshing is carried out reaches to a first predetermined value (Pre1).

13. A method for protecting content of a semiconductor non-volatile memory and the non-volatile memory itself as claimed in claim 7, which further comprises the steps of:

k) counting a number of times the refreshing is carried out, and l) allocating a byte, a memory block, or an address of a sector, to each of which a corresponding one of the selected bits for which the refreshing is carried out belongs, to a non-used byte, a non-used memory block, or a non-used address of the sector when the counted number of times the refreshing is carried out reaches to a first predetermined value (Pre1).

14. A method for protecting content of a semiconductor non-volatile memory and the non-volatile memory itself as claimed in claim 11, wherein a CPU carries out the step of m).

15. A method for protecting content of a semiconductor non-volatile memory and the non-volatile memory itself as claimed in claim 8, wherein either the first data deterioration determining voltage ($V_1$) or the third data deterioration determining voltage ($V_3$) is set to be equal to the rated power supply voltage ($V_{CC}$).

16. A method for protecting content of a semiconductor non-volatile memory and the non-volatile memory itself as claimed in claim 4, which further comprises the steps of:

n) calculating a use time duration (t) during which the non-volatile memory has been used; and o) determining whether the use time duration (t) has reached to a predetermined value (Pre2), and wherein the steps a) through m) are carried out when determining that the use time duration (t) has reached to the second predetermined value (Pre2).

17. A method for protecting content of a semiconductor non-volatile memory and the non-volatile memory itself as claimed in claim 5, which further comprises the steps of:

k) calculating a use time duration (t) during which the non-volatile memory has been used; and l) determining whether the use time duration has reached to a predetermined value (Pre2), and wherein the steps a) through j) are carried out when determining that the use time duration (t) has reached to the predetermined value (Pre2).

18. A method for protecting content of a semiconductor non-volatile memory and the non-volatile memory itself as claimed in claim 4, which further comprises the steps of:

n) calculating a use time duration (t) during which the nonvolatile memory has been used;

o) calculating an equation (F) of Temp dt, wherein Temp denotes a value of a use environment temperature of the non-volatile memory use;

p) determining whether a result of the calculation of the equation (F) at the step o) is equal to or larger than a predetermined value (Pre3); and the steps a) through m) are carried out when determining that the result of the calculation of the equation (F) at the step o) is equal to or larger than the predetermined value (Pre3).

19. A method for protecting content of a semiconductor non-volatile memory and the non-volatile memory itself as claimed in claim 5, which further comprises the steps of:

k) calculating a use time duration (t) during which the non-volatile memory has been used;

l) calculating an equation (F) of Temp dt, wherein Temp denotes a value of an ambient temperature of the non-volatile memory in use;

m) determining whether a result of the calculation of the equation (F) at the step l) is equal to or larger than a predetermined value (Pre3); and the steps a) through j) are carried out when determining that the result of the calculation of the equation (F) at the step l) is equal to or larger than the predetermined value (Pre3).

20. A method for protecting content of a semiconductor non-volatile memory and the non-volatile memory itself as claimed in claim 4, wherein the step m) of refreshing is carried out after a regular operation of the CPU which reads the data in the non-volatile memory is halted or the step m) of refreshing is carried out when the rated power supply voltage is supplied to the non-volatile memory and, thereafter, the regular operation of the CPU is started.

21. A method for protecting content of a semiconductor non-volatile memory and the non-volatile memory itself as claimed in claim 5, wherein the step j) of refreshing is carried out after a regular operation of the CPU which reads the data in the non-volatile memory is halted or the step j) of refreshing is carried out when the rated power supply voltage is supplied to the non-volatile memory and, thereafter, the regular operation of the CPU is started.

22. A method for protecting content of a semiconductor non-volatile memory and the non-volatile memory itself as claimed in claim 8, wherein a data failure detecting purpose transistor is installed in the non-volatile memory for each memory block and the steps a) through m) are carried out for the individual data failure detecting purpose transistors and which the method further comprises the step of q) allocating an address of a corresponding one of the memory blocks to which the data failure detecting purpose transistor on the basis of which the abnormality signal is developed belongs to a non-used address of one of the remaining memory blocks.

23. A method fox protecting content of a semiconductor non-volatile memory and the non-volatile memory itself as claimed in claim 8, wherein a data failure detecting purpose transistor is installed in the non-volatile memory for each sector and the steps a) through m) are carried out for the date failure detecting purpose transistors and which the method further comprises the step of q) allocating an address of a corresponding one of the sectors to which the data failure detecting purpose transistor on the basis of which the abnormality signal is developed belongs to a non-used address of one of the remaining sectors.

24. A method for protecting content of a semiconductor non-volatile memory and the non-volatile memory itself as claimed in claim 9, wherein a data failure detecting purpose transistor is installed in the non-volatile memory for each memory block and the steps a) through k) are carried out for the data failure detecting purpose transistors and which the method further comprises the step of l) allocating an address of a corresponding one of the memory blocks to which the data failure detecting purpose transistor on the basis of which the abnormality signal is developed belongs to a non-used address of one of the remaining memory blocks.

25. A method for protecting content of a semiconductor non-volatile memory and the non-volatile memory itself as claimed in claim 9, wherein a data failure detecting purpose transistor is installed in the non-volatile memory for each sector and the steps a) through k) are carried out for the data failure detecting purpose transistors and which the method further comprises the step of l) allocating an address of a corresponding one of the sectors to which the data failure detecting purpose transistor on the basis of which the abnormality signal is developed belongs to a non-used address of one of the remaining sectors.

26. A method for protecting content of a semiconductor non-volatile memory and the non-volatile memory itself as claimed in claim 18, wherein the non-volatile memory is installed within an engine hood of an automotive vehicle.

27. A circuitry having a semiconductor non-volatile memory, the non-volatile memory being taken in a matrix form in which a plurality of memory cells are disposed at intersections of word lines and bit lines sired in the matrix formed non-volatile memory, each memory cell constituting a bit, the bit having a floating gate surrounded by an isolating film, and storing date according to a relatively high threshold voltage condition and a relatively low threshold voltage condition, each of the relatively high and low threshold voltage conditions being developed so as to correspond to a relatively large quantity of charges of electrons within each corresponding one of the floating gates of the bits and a relatively small quantity of charges of electrons therewithin, the circuitry comprising:

a) a write circuit for writing data in each bit of the non-volatile memory;

b) a read circuit for reading the data in each bit of the non-volatile memory;

c) a column decoder via which both the write circuit and the read circuit are connected to each of the bit lines in the non-volatile memory;

d) a row decoder;

e) a DC voltage generator capable of applying at least a first data deterioration determining voltage ($V_1$) to each of the word lines to which control gates of the respective bits are connected via the row decoder, the first data deterioration determining voltage falling in a first voltage level range approximately front the relatively high threshold voltage to a rated power supply voltage ($V_{CC}$);

f) a control circuit for controlling operations of the write circuit, the read circuit, the column decoder, the row decoder, and the DC voltage generator; and g) a memory unit separate from the nonvolatile memory, the control circuit selecting any one of the bits in the nonvolatile memory through the row decoder and the column decoder, applying the first data deterioration determining voltage to a corresponding one of the word lines in the non-volatile memory to which a control gate of the selected bit is connected via the DC voltage generator, storing a result of the application of the first data deterioration determining voltage from one of the bit lines of the non-volatile memory connected to the selected bit via the column decoder into the memory unit, reading the stored result of the application of the first data deterioration determining voltage, determining whether the selected bit in the non-volatile memory is turned on from the stored result of the application of the first data deterioration determining voltage, and developing a data deterioration possibility signal indicating that a possibility of the data deterioration in the selected bit is relatively high.

28. A circuitry as claimed in claim 27, wherein the DC voltage generator is capable of applying a second data deterioration determining voltage ($V_2$) to the corresponding one of the word lines to which the control gate of the selected bit is connected, the second data deterioration determining voltage falling in a second voltage level range approximately from the rated power supply voltage to the relatively low threshold voltage, and wherein the control circuit stores a result of the application of the second data deterioration determining voltage from the bit lines of the non-volatile memory into the memory unit via the column decoder, reads the stored result of the application of the second data deterioration determining voltage from the memory unit, determines whether the selected bit is turned off according to the read result of the application of the second data deterioration determining voltage from the memory unit, and develops a data deterioration signal indicating that the data in the selected bit is deteriorated when determining that the selected bit of the memory cells is turned off when the second data deterioration determining voltage is applied via the DC voltage generator.

29. A circuitry as claimed in claim 27, which further comprises a sense amplifier connected to the column decoder and having at least a comparator and an inverter and wherein the control circuit determines whether a magnitude of a turn on voltage of the selected bit is below a turn-on voltage reference value ($V_{REF}$) through the comparator and develops a data deterioration signal indicating that the data in the selected bit of the memory cells which is determined to be turned on is deteriorated when determining that the magnitude of the turn on voltage of the selected bit is below the turn-on voltage reference value according to an inconsistency of output logical levels of the comparator and the inverter.

30. An apparatus for protecting content of a semiconductor non-volatile memory and the non-volatile memory itself, the non-volatile memory being taken in a matrix form in which a plurality of memory cells are disposed at intersections of word lines and bit lines wired in the matrix formed non-volatile memory, each memory cell constituting a bit, the bit having a floating gate surrounded by an isolating film, and storing data according to a relatively high threshold voltage condition and a relatively low threshold voltage condition, each of the relatively high and low threshold voltage conditions being developed so as to correspond to a relatively large quantity of charges of electrons within each corresponding one of the floating gates of the bits and a relatively small quantity of charges of electrons therewithin, the apparatus comprising:

a) first means for selecting any one of the bits in the non-volatile memory;

b) second means for applying a first data deterioration determining voltage to a corresponding one of the word lines in the non-volatile memory to which a control gate of the selected bit is connected, the first data deterioration determining voltage falling in a first voltage level range approximately from the relatively high threshold voltage to a rated power supply voltage to the non-volatile memory;

c) third means for storing a result of the application of the first data deterioration determining voltage from one of the bit lines of the non-volatile memory connected to the selected bit into other memory unit;

d) fourth means for reading the stored result of the application of the first data deterioration determining voltage;

e) fifth means for determining whether the selected bit in the non-volatile memory is turned on from the stored result of the application of the first data deterioration determining voltage; and f) sixth means for developing a data deterioration possibility signal indicating that a possibility of the data deterioration in the selected bit is relatively high.

31. An apparatus for protecting content of a semiconductor non-volatile memory and the non-volatile memory itself as claimed in claim 30, which further comprises:

g) seventh means for applying a second data deterioration determining voltage to the corresponding one of the word lines to which the control gate of the selected bit is connected, the second data deterioration determining voltage falling in a second voltage level range approximately from the rated power supply voltage to the relatively low threshold voltage;

h) eighth means for storing a result of the application of the second data deterioration determining voltage from the bit lines of the non-volatile memory into the other memory unit;

i) ninth means for reading the stored result of the application of the second data deterioration determining voltage from the other memory unit;

j) tenth means for determining where the selected bit is turned off according to the read result of the application of the second data deterioration determining voltage by the ninth means; and k) eleventh means for developing a data deterioration signal indicating that the data in the selected bit is deteriorated when determining that the selected bit of the memory cells is turned off by the tenth means.

32. An apparatus for protecting content of a semiconductor non-volatile memory and the non-volatile memory itself as claimed in claim 30, which further comprises:

g) seventh means for determining whether a magnitude of a turn on voltage of the selected bit is below a turn-on voltage reference value ($V_{REF}$); and h) eighth means for developing a data deterioration signal indicating that the data in the selected bit of the memory cells which is determined to be turned on by the fifth means is deteriorated when determining that the magnitude of the turn on voltage of the selected bit is below the turn-on voltage reference value by the seventh means.

* * * * *